United States Patent
Ando et al.

(10) Patent No.: US 10,892,402 B2
(45) Date of Patent: Jan. 12, 2021

(54) MAGNETORESISTIVE ELEMENT, AND PRODUCTION METHOD FOR MAGNETORESISTIVE ELEMENT

(71) Applicants: Tohoku University, Sendai (JP); Konica Minolta, Inc., Tokyo (JP)

(72) Inventors: Yasuo Ando, Sendai (JP); Mikihiko Oogane, Sendai (JP); Kosuke Fujiwara, Sendai (JP); Junichi Jono, Tokyo (JP); Koujirou Sekine, Ibaraki (JP); Masaaki Tsuchida, Hachioji (JP)

(73) Assignees: KONICA MINOLTA, INC., Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/475,503

(22) PCT Filed: Jan. 16, 2018

(86) PCT No.: PCT/JP2018/000917
§ 371 (c)(1),
(2) Date: Jul. 2, 2019

(87) PCT Pub. No.: WO2018/139249
PCT Pub. Date: Aug. 2, 2018

(65) Prior Publication Data
US 2019/0348599 A1 Nov. 14, 2019

(30) Foreign Application Priority Data
Jan. 24, 2017 (JP) .................................. 2017-010201

(51) Int. Cl.
*H01L 43/12* (2006.01)
*H01L 43/08* (2006.01)
(Continued)

(52) U.S. Cl.
CPC .............. *H01L 43/08* (2013.01); *H01L 43/02* (2013.01); *H01L 43/10* (2013.01); *H01L 43/12* (2013.01)

(58) Field of Classification Search
CPC ........... G11B 5/39; H01L 43/08; H01L 43/10; H01L 43/12
See application file for complete search history.

(56) References Cited

U.S. PATENT DOCUMENTS

2001/0026424 A1 10/2001 Kamata et al.
2009/0046395 A1* 2/2009 Maehara ....................... 360/319

FOREIGN PATENT DOCUMENTS

CN 101379557 A 3/2009
JP 2004206822 A 7/2004
(Continued)

OTHER PUBLICATIONS

PCT, International Preliminary Report on Patentability for the corresponding Application No. PCT/JP2018/000917, dated Jul. 20, 2019, with English translation (14 pages).
(Continued)

*Primary Examiner* — Thomas L Dickey
(74) *Attorney, Agent, or Firm* — Lucas & Mercanti, LLP

(57) ABSTRACT

Provided is a production method for a magnetoresistive element including treating a stacked layer into a predetermined shape. The stacked layer includes a magnetoresistive layer whose resistance changes depending on a magnetic field and a cap layer above the magnetoresistive layer and having a thickness in a range of 10 nm to 60 nm. The method further includes covering and protecting the stacked layer with an insulating layer, forming an opening in the insulating layer by reactive etching and exposing a surface of the cap layer at the opening, etching the cap layer in a range less than a total thickness of the cap layer by ion milling of the surface, and depositing an upper layer to be a part of the
(Continued)

magnetoresistive element. The upper layer is in contact with the surface of the cap layer after the etching.

13 Claims, 8 Drawing Sheets

(51) Int. Cl.
*H01L 43/02* (2006.01)
*H01L 43/10* (2006.01)

(56) References Cited

FOREIGN PATENT DOCUMENTS

| JP | 4136261 B2 | 8/2008 |
| JP | 4322213 B2 | 8/2009 |
| WO | 2007105459 A1 | 9/2007 |

OTHER PUBLICATIONS

Chinese Intellectual Property Office, Chinese Office Action dated Jul. 3, 2020 from corresponding Chinese Patent Application No. 201880008084.X and its English machine translation (19 pages).
International Search Report dated Mar. 27, 2018 for PCT/JP2018/000917 and English translation.

* cited by examiner

MAGNETORESISTIVE ELEMENT, AND PRODUCTION METHOD FOR MAGNETORESISTIVE ELEMENT

CROSS REFERENCE TO RELATED APPLICATION

This Application is a 371 of PCT/JP2018/000917 filed on Jan. 16, 2018 which, in turn, claimed the priority of Japanese Patent Application No. 2017-010201 filed on Jan. 24, 2017, both applications are incorporated herein by reference.

TECHNICAL FIELD

The present invention relates to a magnetoresistive element and a production method for the magnetoresistive element.

BACKGROUND ART

A magnetoresistive element is used in a magnetic memory, a magnetic head, a magnetic sensor, and the like.

For example, a tunnel magnetoresistive element (TMR (Tunnel Magneto Resistive) element) has a pinned magnetic layer in which the magnetization direction is pinned (fixed), a free magnetic layer in which a magnetization direction changes depending on an external magnetic field, and an insulating layer arranged between the pinned magnetic layer and the free magnetic layer, and forms a magnetic tunnel junction (MTJ).

A stacked layer of the magnetoresistive element is partly deteriorated (due to exposure to the atmosphere, influence by reactive gas, and the like) through treating processes, and electrical resistance in the current path increases as a result.

The magnetoresistance characteristic is degraded when unnecessary electric resistance increases in the stacked layer. Therefore, increase of unnecessary resistance caused in the treating processes should be minimized.

Focusing on the fact that the resistance increases due to formation of an oxide layer on the surface of the stacked layer when exposed to the atmosphere, adsorption gas, and the like, there is known a technique for reducing resistance including: forming a cap layer on the surface of the stacked layer for protection during the treating processes; completely removing the cap layer deteriorated during the treating processes by a method such as ion milling for adsorption immediately before depositing the upper electrode; and depositing an upper electrode after that (Patent Documents 1 and 2).

CITATION LIST

Patent Literature

[Patent Document 1] Japanese Patent No 4322213
[Patent Document 2] Japanese Patent No 4136261

SUMMARY OF INVENTION

Technical Problem

However, if the cap layer is removed by ion milling, the layer structure under the cap layer would be also slightly milled in fact because of the limit of treating accuracy. Therefore, there may be a risk that the function cannot be exhibited normally or a problem that the stacked layer cannot be exposed to the atmosphere after removing the cap layer.

Therefore, there is a need for a multilayer configuration and a treating procedure that can appropriately remove only the deteriorated portion(s) while leaving the cap layer partly.

The present invention has been made in view of the above problems in the above conventional techniques. The object of the present invention is to achieve desired magnetoresistance characteristics in forming a magnetoresistive layer by effectively achieving protection with a cap layer and by reducing adverse effects of the cap layer.

Solution to Problem

In order to solve the above problems, the invention according to item 1 provides a production method for a magnetoresistive element, including:

a first step in which a stacked layer is treated into a predetermined shape, the stacked layer including a magnetoresistive layer whose resistance changes depending on a magnetic field and a cap layer which is above the magnetoresistive layer and which has a layer thickness in a range of 10 nm to 60 nm;

a second step in which the stacked layer is covered and protected with an insulating layer;

a third step in which an opening is formed in the insulating layer by reactive etching and a surface of the cap layer is exposed at the opening;

a fourth step in which the cap layer is etched in a range less than a total layer thickness of the cap layer by ion milling of the surface of the cap layer which is exposed at the opening in the third step; and a fifth step in which an upper layer to be a part of the magnetoresistive element is deposited, the upper layer being in contact with the surface of the cap layer which is left after the fourth step.

The invention according to item 2 provides the production method for a magnetoresistive element according to item 1, wherein, in the fourth step, a layer thickness of the cap layer etched by ion milling is in a range of 0.5 nm to 59.5 nm.

The invention according to item 3 provides the production method for a magnetoresistive element according to item 1 or 2, wherein one or more materials of the cap layer are selected from the following: Ru, Ta, Al, Ag, Au, Si, Ti, V, Zr, Nb, Mo, Hf, and W.

The invention according to item 4 provides the production method for a magnetoresistive element according to item 1, 2, or 3, wherein a material of the insulating layer is thermally oxidized silicon, and a gas for processing used in the reactive etching is a mixed gas including fluorine and oxygen.

The invention according to item 5 provides the production method for a magnetoresistive element according to any one of claim items 1 to 4, wherein an outer edge of the opening formed in the third step is inside an outer edge of the cap layer which has been treated in the first step.

The invention according to item 6 provides a magnetoresistive element including:

a magnetoresistive layer whose resistance changes depending on a magnetic field;

a cap layer above the magnetoresistive layer; and an upper layer which is a part of the magnetoresistive element and in contact with the surface of the cap layer, wherein the cap layer has a hollow structure which is a hollow surface on an opposite side of the magnetoresistive layer, wherein the upper layer which is a part of the magnetoresistive element is in contact with an inner bottom surface of the hollow surface, and wherein the cap layer has a layer thickness in a range of 10 nm to 60 nm around the inner bottom surface of the hollow structure.

The invention according to item 7 provides the magnetoresistive element according to item 6, wherein a distance between the inner bottom surface of the hollow structure and an upper edge around the inner bottom surface is in a range of 0.5 nm to 59.5 nm.

The invention according to item 8 provides the magnetoresistive element according to item 6 or 7, wherein one or more materials of the cap layer are selected from the following: Ru, Ta, Al, Ag, Au, Si, Ti, V, Zr, Nb, Mo, Hf, and W.

The invention according to item 9 provides the magnetoresistive element according to any one of items 6 to 8, wherein an insulating layer covers and protects a periphery of the magnetoresistive layer, a periphery of the cap layer, an upper edge surface around the inner bottom surface of the hollow structure, and a periphery of the upper layer which is a part of the magnetoresistive element.

The invention according to item 10 provides the magnetoresistive element according to item 9, wherein a material of the insulating layer is thermally oxidized silicon.

The invention according to item 11 provides the magnetoresistive element according to any one of items 6 to 10, wherein the upper layer which is a part of the magnetoresistive element is an electrode layer.

The invention according to item 12 provides the magnetoresistive element according to any one of items 6 to 10, wherein the cap layer is in contact with a ferromagnetic layer of the magnetoresistive layer, and wherein the upper layer which is a part of the magnetoresistive element is a soft magnetic layer.

The invention according to item 13 provides the magnetoresistive element according to item 12, wherein a layer thickness of the cap layer between the soft magnetic layer and the ferromagnetic layer is less than 1 nm.

Advantageous Effects of Invention

According to the production method for a magnetoresistive element of the present invention, it is possible to achieve desired magnetoresistance characteristics in forming a magnetoresistive layer by effectively achieving protection with a cap layer and reducing adverse effects of the cap layer.

DESCRIPTION OF EMBODIMENTS

Hereinafter, embodiments of the present invention are described with reference to the drawings. The following is an embodiment of the present invention and does not limit the present invention.

[Outline of Element Structure]

Figure 1:
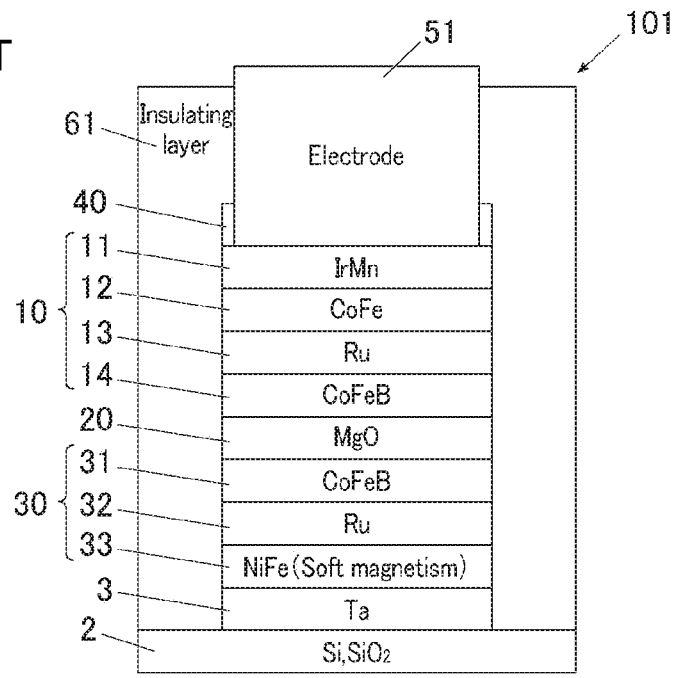
FIG. 1 is a cross-sectional view showing a stack structure of a conventional tunnel magnetoresistive element.

An element structure will be described using a tunnel magnetoresistive element as an example. FIG. 1 shows a stack structure of a tunnel magnetoresistive element of the conventional example, FIG. 2 shows a stack structure of a tunnel magnetoresistive element of an inventive example, and FIG. 3 shows a stack structure of a tunnel magnetoresistive element of another inventive example.

As shown in FIG. 1, the tunnel magnetoresistive element 101 of the conventional example has a stack structure as follows: on a substrate (Si, $SiO_2$) 2 is formed an underlayer (Ta) 3; as a free magnetic layer 30 stacked thereon are a soft magnetic layer (NiFe or CoFeSiB) 33, a magnetic coupling layer (Ru) 32, and a ferromagnetic layer (CoFeB) 31 from below; and as a pinned magnetic layer 10 stacked thereon via an insulating layer (MgO) 20 are a ferromagnetic layer (CoFeB) 14, a magnetic coupling layer (Ru) 13, a ferromagnetic layer (CoFe) 12, and an antiferromagnetic layer (IrMn) 11 from below.

Further provided thereon are a cap layer 40 formed on the antiferromagnetic layer (IrMn) 11 and an insulating layer (thermally oxidized silicon and the like) 61 for covering and protecting the above stack structure. An electrode layer 51 is formed contacting the surface of the antiferromagnetic layer (IrMn) 11 via an opening which is formed so as to penetrate the cap layer 40 and the insulating layer 61. The electrode layer 51 is exposed at the upper edge of the insulating layer 61.

Figure 2:
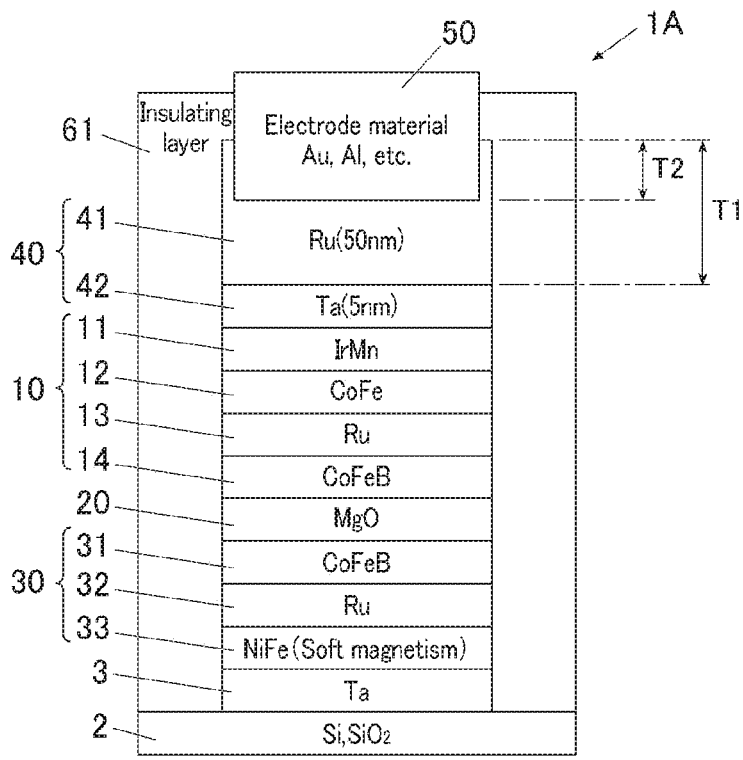
FIG. 2 is a cross-sectional view showing a stack structure of a tunnel magnetoresistive element of the present invention.
Figure 3:
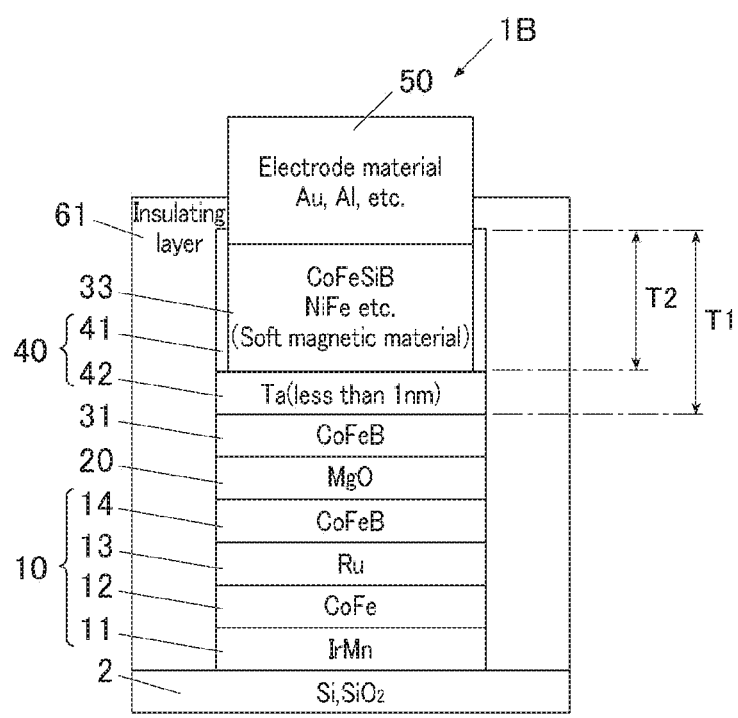
FIG. 3 is a cross-sectional view showing a stack structure of another tunnel magnetoresistive element of the present invention.

In contrast, as shown in FIG. 2, the tunnel magnetoresistive element 1A of an inventive example is similar to the above tunnel magnetoresistive element 101 of the conventional example as for the stack structure from a substrate (Si, $SiO_2$) 2 to an antiferromagnetic layer (IrMn) 11, but different in that the cap layer 40 is between the antiferromagnetic layer (IrMn) 11 and an upper layer 50. The upper layer 50 is a layer which is a part of a product (magnetoresistive element), such as an electrode layer.

In contrast, as shown in FIG. 3, in the tunnel magnetoresistive element 1B of the inventive example, the pinned magnetic layer 10 and the free magnetic layer 30 are stacked upside down, with the insulating layer (MgO) 20 between them. The cap layer 40 is between the ferromagnetic layer (CoFeB) 31 and the soft magnetic layer (NiFe or CoFeSiB) 33.

As described above, the magnetoresistive layer whose resistance is changed depending on a magnetic field is formed of at least the ferromagnetic layer (CoFeB) 14, the insulating layer (MgO) 20, and the ferromagnetic layer (CoFeB) 31.

The magnetoresistance elements of Inventive Examples 1A and 1B each includes a cap layer 40 above the magnetoresistive layer (14, 20, 31) and an upper layer (the upper layer 50 in Inventive Example 1A, and the soft magnetic layer (NiFe or CoFeSiB) 33 in Inventive Example 1B) in contact with the surface of the cap layer 40 and composing a part of a product.

The cap layer 40 in Inventive Examples 1A and 1B has a hollow structure having a hollow surface on the opposite side of the magnetoresistive layer (14, 20, 31). The upper layer (50 or 33) as a part of the product in contact with the inner bottom surface of the hollow structure. This is a unique structure as compared to Conventional Example 101. The outer edge portion of the cap layer 40 is left in Conventional Example 101 and Inventive Examples 1A and 1B as a result of making the insulating layer 61 not shaved.

As shown in FIG. 2 or 3, the insulating layer 61 covers and protects the periphery of the magnetoresistive layer (14, 20, 31), the periphery of the cap layer 40, the upper edge surface around the inner bottom surface of the hollow structure of the cap layer 40, and the periphery of the upper layer (50 or 33) which is a part of the product.

In Inventive Example 1B, the layer in contact with the cap layer 40 of the magnetoresistive layer (14, 20, 31) is the ferromagnetic layer 31, and the upper layer as a part of the product is the soft magnetic layer 33.

The cap layer 40 in Inventive Example 1A or 1B is composed of a Ru layer 41 and a Ta layer 42. One or more materials of the cap layer 40 may be selected from the following: Ru, Ta, Al, Ag, Au, Si, Ti, V, Zr, Nb, Mo, Hf, and W.

Although the Ta layer 42 of the cap layer 40 is necessary for achieving a high TMR ratio at the time of in-magnetic field annealing, the material of the Ta layer 42 is oxidized very easily so as to cause stray resistance in the TMR sensor easily, which results in performance degradation.

In Inventive Examples 1A and 1B, the cap layer 40 is sufficiently thick by including not only the Ta layer 42 but also the Ru layer 41 on the Ta layer 42. The cap layer 40 is then removed from the surface by etching in the direction of stacking but is partially left, since the range of etching is less than the entire thickness of the cap layer 40. Desired magnetoresistive characteristics can be achieved by the resulting effective protection by the cap layer 40 and the reduced adverse effect by the cap layer 40 in forming the magnetoresistive layer.

In Inventive Example 1A, about half of the Ru layer 41 in the cap layer 40 is removed in the stacking direction. In Inventive Example 1B, the Ru layer 41 is completely removed in the stacking direction and the Ta layer 42 is left slightly, a little less than 1 nm in thickness. Thus, the layer thickness of the cap layer 40 (42) between the soft magnetic layer 33 and the ferromagnetic layer 31 is preferably less than 1 nm for improving the magnetic coupling between the soft magnetic layer 33 and the ferromagnetic layer 31.

The layer thickness T1 of the cap layer 40 around the inner bottom surface of the above-described hollow structure is in the range of 10 nm to 60 nm. The layer thickness T1 corresponds to the total thickness of the cap layer 40. The thickness of the cap layer 40 before etching can be sufficient.

The distance T2 between the inner bottom surface of the above-described hollow structure and the upper edge around the inner bottom surface is in the range of 0.5 nm to 59.5 nm. The distance T2 corresponds to the layer thickness of the cap layer 40 to be etched.

[Production Method 1]

Next, a production method will be described in the case of producing a structure of the tunnel magnetoresistive element 1A of the inventive example, having the pinned magnetic layer 10 on the upper side.

(First Step)

Figure 4:
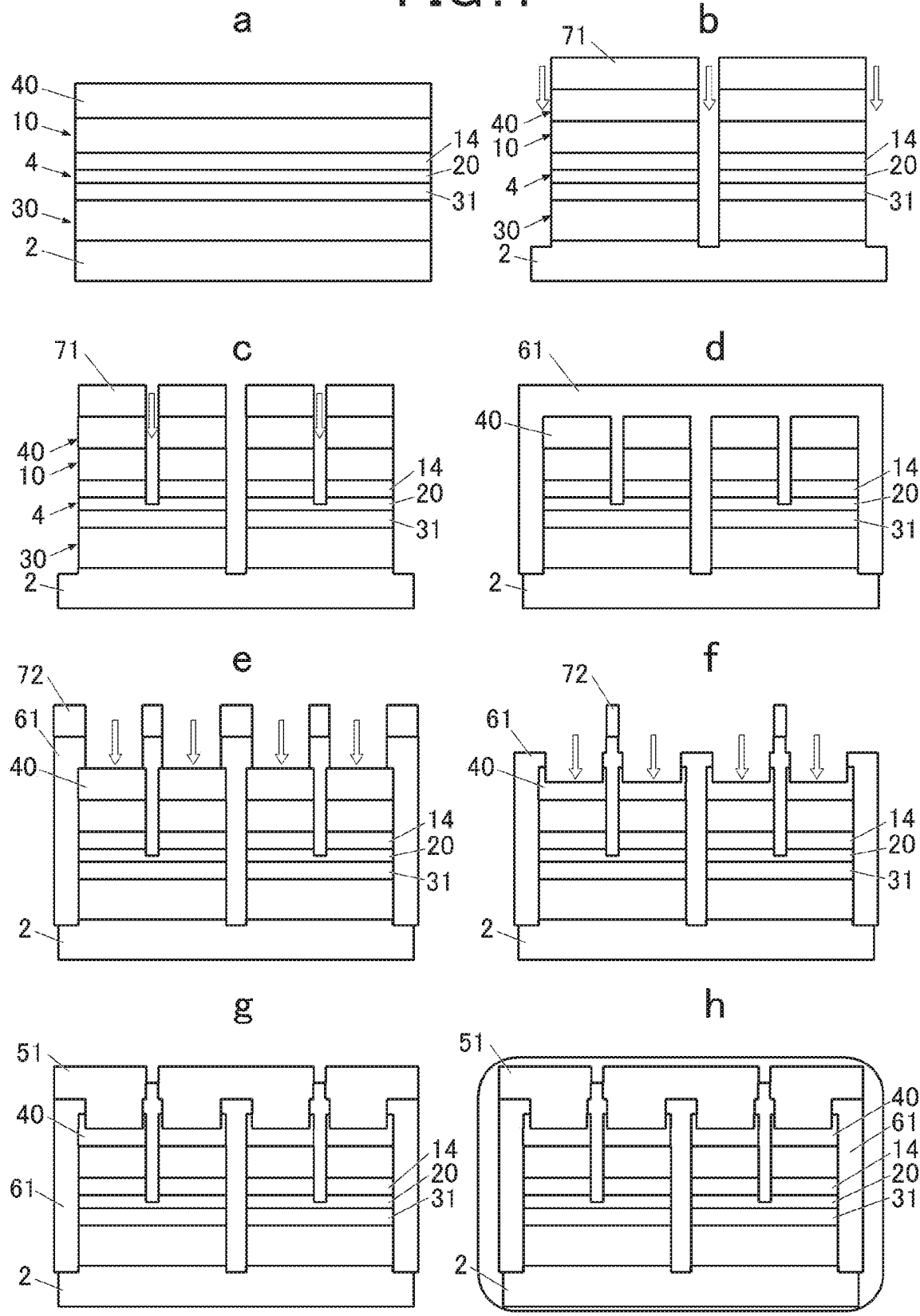
FIG. 4 is a cross-sectional view showing steps of a production method of a magnetoresistive element of an example of the present invention.

An MTJ (Magnetic Tunnel Junction) stacked layer includes a ferromagnetic tunnel junction (MTJ) 4 and the cap layer 40 which are stacked on a substrate 2 as shown in FIG. 4 (Section a). The ferromagnetic tunnel junction (MTJ) 4 corresponds to the magnetoresistive layer. On the surface of the MTJ stacked layer, there is formed a resist pattern 71 by photolithography or electron beam lithography (in the present embodiment, by photolithography) as shown in FIG. 4 (Section b).

Penetrating process for element isolation (FIG. 4 (Section b)) of the above MTJ stacked layer and etching processing (FIG. 4 (Section c)) to the insulating layer (MgO) 20 are performed by Ar ion milling of the above MTJ stacked layer in which the resist pattern 71 is formed.

(Second Step)

After removal of the resist pattern 71, the exposed MTJ stacked layer is covered and protected with an insulating layer 61 (FIG. 4 (Section d)). In the inventive example, the $SiO_2$ layer is formed as the insulating layer 61 by low temperature CVD and TEOS. The insulating layer 61 can be formed by sputtering or low temperature CVD. Instead of $SiO_2$, an insulating material such as $AlO_2$ may be used as the material.

(Third Step)

In order to make the necessary electrical contact to the above MTJ stacked layer protected by the insulating layer 61, a resist pattern 72 is formed to form an opening(s) as shown in FIG. 4 (Section e), reactive etching is performed using a gas for processing such as $CHF_3$ or $CH_4$, and the opening is formed in the insulating layer 61 to expose the surface of the cap layer 40.

The outer edge of the opening formed in Third Step is inside the outer edge of the cap layer 40 treated in First Step.

(Fourth Step)

The surface of the cap layer 40 exposed in the opening of the insulating layer 61 is etched by Ar ion milling as shown in FIG. 4 (Section f) so that the cap layer 40 is etched in a range less than the entire thickness thereof. This treatment makes it possible to remove deteriorated portion(s) in the cap layer 40 which have occurred in forming the insulating layer 61 (Second Step) or in forming contact holes (step S3). As the stray resistance component in the MTJ stacked layer can be removed, it is possible to produce a high performance TMR sensor.

In addition, immediately before deposition of the electrode material at last, it is desirable to remove the portion(s) slightly deteriorated by oxidation or the like on the surface of the remaining cap layer by slightly etching the MTJ stacked layer under vacuum (reverse sputtering).

Since the cap layer 40 is partly left even in the end, the magnetic layer underlying the cap layer can be protected against subsequent treating processes, aging degradation, and the like.

The layer thickness (T2) of the cap layer 40 etched by ion milling in Fourth Step is in the range of 0.5 nm to 59.5 nm with the premise that the layer thickness (T2) is less than the total layer thickness (T1) of the cap layer 40.

According to a typical material configuration required for expressing high TMR ratio at the in-magnetic field annealing, the cap layer 40 of the inventive example includes a Ta layer 42 with a thickness of about 5 nm and a Ru layer 41 with a thickness of about 50 nm. About half (about 20 nm) of the Ru layer 41 only is removed by Ar etching.

According to the present invention, the same effect can be obtained even with other combinations of materials resulting in high TMR ratios. For example, instead of Ta of the Ta layer 42, materials such as Si, Ti, Zr, Nb, Mo, or Hf may be used. Also, instead of Ru of the Ru layer 41, materials such as Rh, Pd, Ag, Ir, Pt, or Au may be used.

(Fifth Step)

As shown in FIG. 4 (Section g), an electrode material 51 in contact with the surface of the cap layer 40 remaining after Fourth Step is deposited to form an electrode portion.

(In-Magnetic Field Annealing)

Figure 5:
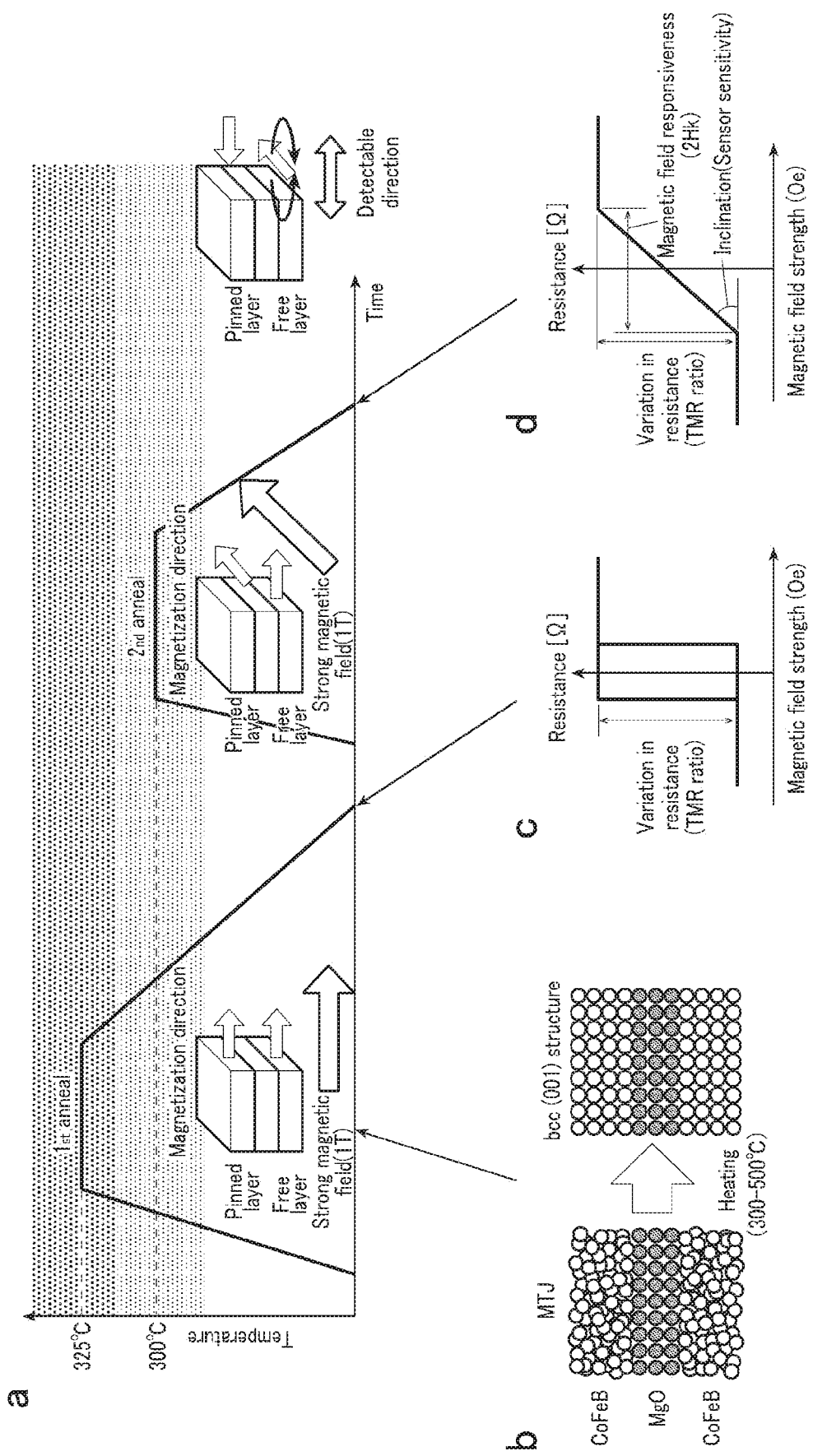
FIG. 5 is a view showing an outline of a step of in-magnetic field annealing and a change in structure and characteristics associated therewith.

After that, in-magnetic field annealing is performed multiple times where direction of the applied magnetic field and temperature in the furnace are different from each other, so that the magnetization direction of the pinned magnetic layer 10 and the magnetization direction of the free magnetic layer 30 are inclined by, for example, 90 degrees. Then, it is possible to obtain characteristics suitable for a high sensitivity sensor whose resistance changes in proportion to a magnetic field as shown in FIG. 5 (Section d). FIG. 5 shows an outline of the in-magnetic field annealing and the structure/characteristic change associated therewith.

As shown in FIG. 4 (Section h), the structure after Fifth Step is put in a furnace, and in-magnetic field annealing is performed at a temperature of about 300 to 500° C. (1st-anneal). If the crystal structure inside the MTJ stack layer is uniform at this time as shown in FIG. 5 (Section b), the tunnel magnetoresistance effect is lost less.

This heat treatment (1st-anneal) greatly improves the tunnel magneto-resistance (TMR) ratio, which is the rate of change in resistance (FIG. 5 (Section c)).

Furthermore, in a 2nd-anneal performed at a lower temperature (300° C. or less) than and in a different magnetic field application direction from the first in-magnetic field annealing (1st-anneal), the uniaxial anisotropy direction changes only in the pinned magnetic layer 10 in the MTJ stacked layer. As a result, the TMR sensor obtains high sensitivity (FIG. 5 (Section d)).

[Production Method 2]

Next, a production method will be described in the case of producing a structure of the tunnel magnetoresistive element 1B of the inventive example, having the free magnetic layer 30 on the upper side.

(First Step)

Figure 6:
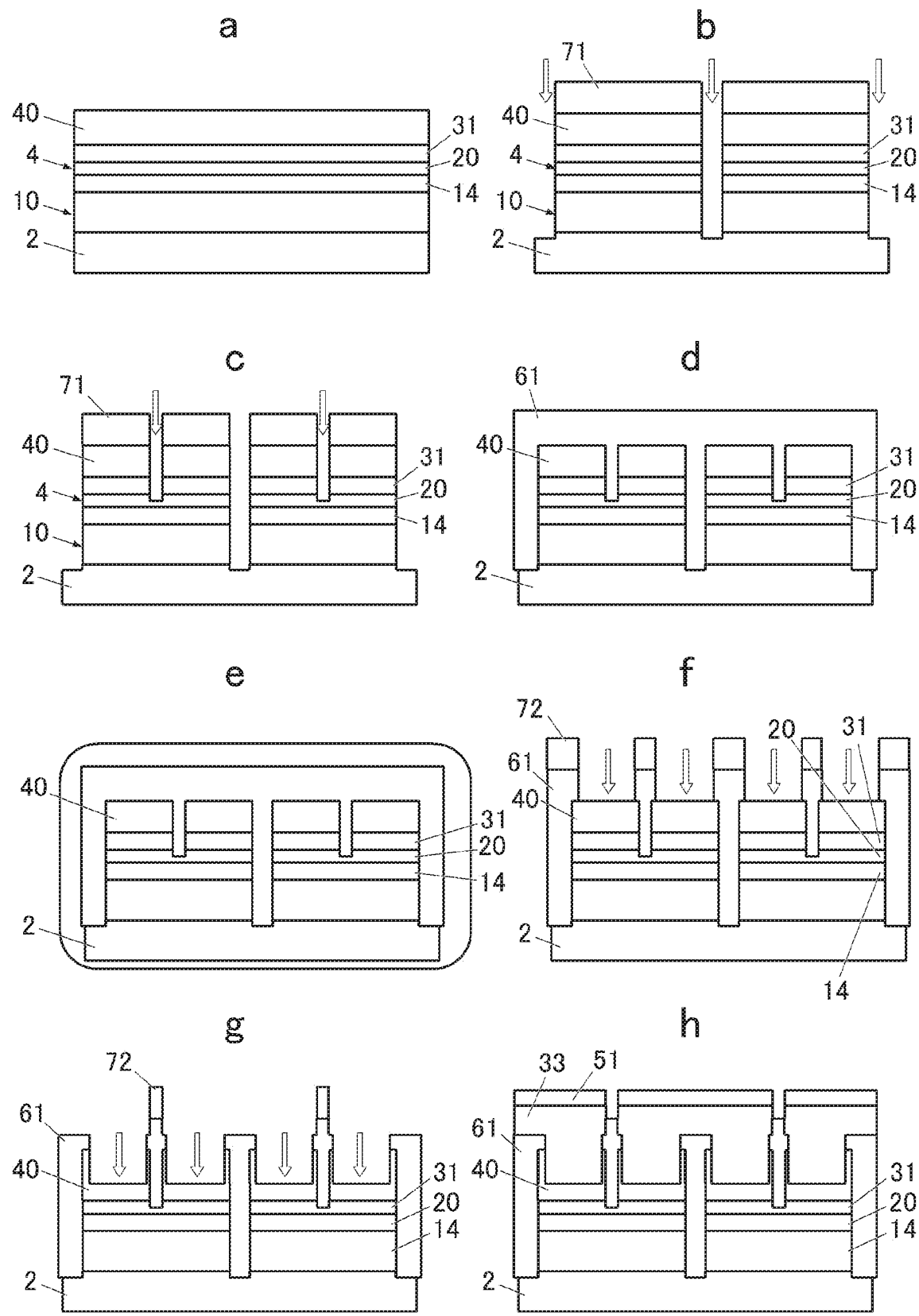
FIG. 6 is a cross-sectional view showing steps of a production method of a magnetoresistive element of another example of the present invention.

An MTJ (Magnetic Tunnel Junction) stacked layer includes a ferromagnetic tunnel junction 4 and the cap layer 40 which are stacked on a substrate 2 as shown in FIG. 6 (Section a). The ferromagnetic tunnel junction (MTJ) 4 corresponds to the magnetoresistive layer. On the surface of the MTJ stacked layer, there is formed a resist pattern 71 by photolithography or electron beam lithography (in the present embodiment, by photolithography) as shown in FIG. 6 (Section b).

Penetrating process for element isolation (FIG. 6 (Section b)) of the above MTJ stacked layer and etching processing (FIG. 6 (Section c)) to the insulating layer (MgO) 20 are performed by Ar ion milling of the above MTJ stacked layer in which the resist pattern 71 is formed.

(Second Step)

After removal of the resist pattern 71, the exposed MTJ stacked layer is covered and protected with an insulating layer 61 (FIG. 6 (Section d)). In the inventive example, the SiO$_2$ layer is formed as the insulating layer 61 by low temperature CVD and TEOS. The insulating layer 61 can be formed by sputtering or low temperature CVD. Instead of SiO$_2$, an insulating material such as AlO$_2$ may be used as the material.

(In-Magnetic Field Annealing)

As shown in FIG. 6 (Section e), the structure after Second Step is put in a furnace, and in-magnetic field annealing is performed at a temperature of about 300 to 500° C. (1st-anneal). This heat treatment greatly improves the tunnel magneto-resistance (TMR) ratio, which is the rate of change in resistance. If the crystal structure inside the MTJ stack layer is uniform at this time as shown in FIG. 5 (Section b), the tunnel magnetoresistance effect is lost less.

This heat treatment (1st-anneal) greatly improves the tunnel magneto-resistance (TMR) ratio, which is the rate of change in resistance (FIG. 5 (Section c)).

In this example, the in-magnetic field annealing (1st-anneal) is performed immediately after forming the insulating layer 61, in consideration of contamination or damage to the MTJ stack layer. However, this process may be performed at any step as long as it is before the step of removing the cap layer (Fourth Step) described later.

(Third Step)

In order to make the necessary electrical contact to the above MTJ stacked layer protected by the insulating layer 61, a resist pattern 72 is formed to form an opening(s) as shown in FIG. 6 (Section f), reactive etching is performed using a gas for processing such as CHF$_3$ or CH$_4$, and the opening is formed in the insulating layer 61 to expose the surface of the cap layer 40.

The outer edge of the opening formed in Third Step is inside the outer edge of the cap layer 40 treated in First Step.

(Fourth Step)

The surface of the cap layer 40 exposed in the opening of the insulating layer 61 is etched by Ar ion milling as shown in FIG. 6 (Section g) so that the cap layer 40 is etched in a range less than the entire thickness thereof. This treatment makes it possible to remove deteriorated portion(s) in the cap layer 40 which have occurred in forming the insulating layer 61 (Second Step), in the in-magnetic field annealing (1st-anneal), or in forming a contact hole (step S3). As the stray resistance component in the MTJ stacked layer can be removed, it is possible to produce a high performance TMR sensor.

In addition, immediately before deposition of the soft magnetic material and the like at last, it is desirable to remove the portion(s) slightly deteriorated by oxidation or the like on the surface of the remaining cap layer by slightly etching the MTJ stacked layer under vacuum (reverse sputtering).

Since the cap layers 40 are partially left even in the end, the magnetic layer underlying the cap layer can be protected against subsequent treating processes, aging degradation, and the like.

The layer thickness (T2) of the cap layer 40 etched by ion milling in Fourth Step is in the range of 0.5 nm to 59.5 nm with the premise that the layer thickness (T2) is less than the total layer thickness (T1) of the cap layer 40.
(Fifth Step)

As shown in FIG. 6 (Section h), a soft magnetic layer 33 in contact with the surface of the cap layer 40 left after Fourth Step and an electrode layer 51 are deposited. As a result, soft magnetic characteristics appear in the magneto-resistance curve, and a TMR sensor is obtained (FIG. 5 (Section d)). At this time, a layer of a soft magnetic material is deposited while a magnetic field is applied in a direction different from that in the first in-magnetic field annealing (1st-anneal) so that the soft magnetic layer has a uniaxial anisotropy. A TMR sensor is thereby obtained (FIG. 5 (Section d)).

Since the cap layer 40 is slightly left after the Ar etching in Fourth Step, the MTJ stacked layer can be protected in the processes from the Ar etching step to the depositing step of the soft magnetic layer 33.

As described above, immediately before deposition of the soft magnetic layer 33, it is desirable to remove the portion(s) slightly deteriorated by oxidation or the like on the surface of the cap layer 40 by slightly etching the MTJ stacked layer under vacuum (reverse sputtering).

Ideally, in order to prevent inhibition of the magnetic coupling between the CoFeB layer 31 and the soft magnetic layer 33 in the MTJ stacked layer due to oxidation of the cap layer 40, the magnetic material(s) under the cap layer 40, or the like, it is desirable to perform etching and deposition continuously under vacuum without exposing the substrate to the air from the etching step of the cap layer 40 to the deposition step of the soft magnetic layer 33.

According to a typical material configuration required for expressing high TMR ratio at the in-magnetic field annealing, the cap layer 40 of this example includes a Ta layer 42 with a thickness of about 5 nm and a Ru layer 41 with a thickness of about 10 nm. In the opening after Ar etching, the Ru layer 41 is completely removed and a little less than 1 nm of the Ta layer 42 is left.

According to the present invention, the same effect can be obtained even with other combinations of materials resulting in high TMR ratios. For example, instead of Ta of the Ta layer 42, materials such as Si, Ti, Zr, Nb, Mo, or Hf may be used. Also, instead of Ru of the Ru layer 41, materials such as Rh, Pd, Ag, Ir, Pt, or Au may be used.

Further, for accurate treatment of the cap layer 40 by etching, a treating method that increases the difference between etching amounts of Si and Ta may be selected instead of Ar etching, that is, the Ru of the Ru layer 41 may be replaced with Si and then a reactive gas such as SF6, having a high etching effect only for Si, may be used.
(Additional In-Magnetic Field Annealing)

After Fifth Step, additional in-magnetic field annealing may be performed at a low temperature (300° C. or lower) to improve the sensitivity of the TMR sensor. By this process, it is possible to change the characteristics as for the uniaxial anisotropy of the soft magnetic layer 33 and to further improve the sensitivity.
[Verification 1]

Next, verification experiments regarding material deterioration due to treating processes will be described.

Figure 7:
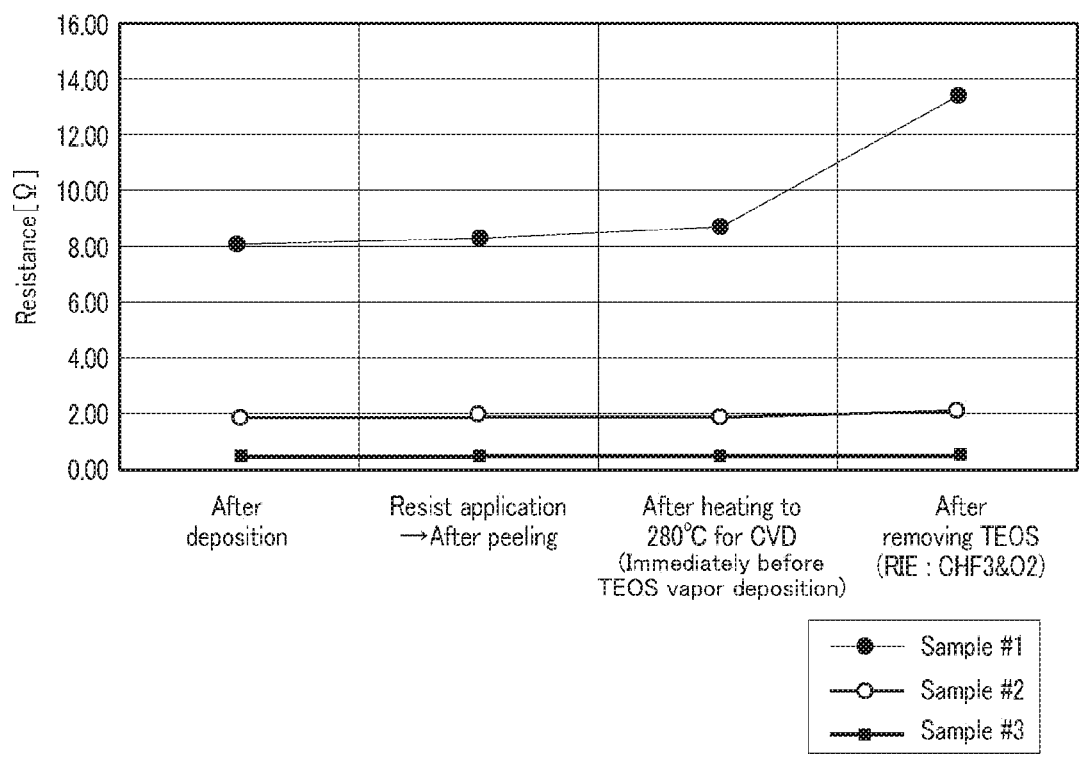
FIG. 7 is a graph showing a change in resistance of a cap layer after treating processes according to Verification 1.

As shown in Table I, thin layer samples (Samples #1 to #3) are prepared by stacking the Ta layer and the Ru layer which are applicable as the cap layer 40. Changes in resistance (sheet resistance of the thin layers measured with a resistivity meter) were evaluated through the treating processes which are considered to have effects on material deterioration. The resistance of the cap layer changed as shown in the graph of FIG. 7 depending on the treating processes.

TABLE I

| Sample name | Construction material and layer thickness | Resistance of sample [Calculated value] (Measured with resistivity meter) |
| --- | --- | --- |
| Sample #1 | Ta(5)/Ru(7) | 7.53 Ω |
| Sample #2 | Ta(15)/Ru(21) | 2.51 Ω |
| Sample #3 | Ta(45)/Ru(63) | 0.84 Ω |
| Remarks | Unit of layer thickness nm | Trial calculation from following resistivity and layer thickness Resistivity of Ta: 1.2E−7 Ωm Resistivity of Ru: 7.6E−8 Ωm |

In the case of Samples #2 and #3 in which the layer thickness of the Ru layer was thick, the resistance did not change in any treating process (the resistance was within the range of the measurement error).

Only in the case of Sample #1 (Ta(5)/Ru(7)) in which the layer thickness of the Ru layer was thin, the resistance slightly increased after heating to 280° C. and increased by 1.35 times after removal of TEOS.
[Verification 2]

According to the experimental results of Verification 1, when the Ru layer was thin, the resistance increased after the subsequent treating processes. On the basis of these results, further verification was conducted.

The resistivity of the material may increase by deterioration of Ta due to the treating processes (heating or gas for processing).

Figure 8:
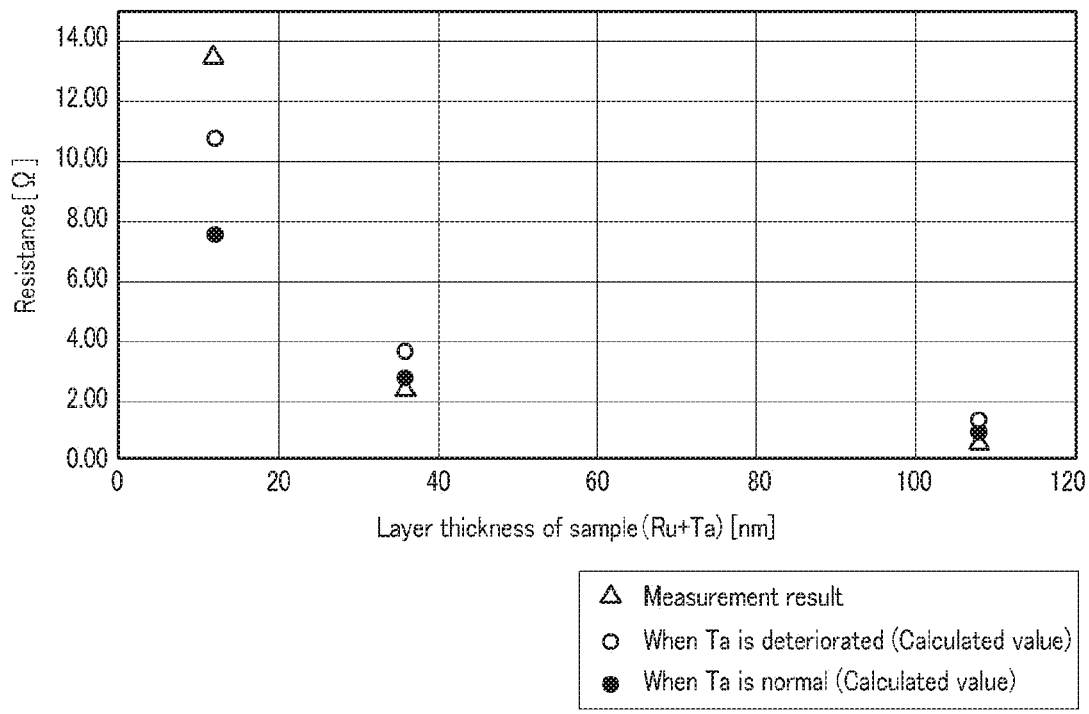
FIG. 8 is a graph showing comparison result of measurement results of resistance of the cap layer after treating processes, calculated values when assumed that Ta in the cap layer is deteriorated, and calculated values when Ta is normal for each layer thickness of a sample according to Verification 2.

The resistance of the sample was calculated on the assumption that Ta was deteriorated and the resistivity extraordinarily increased (by more than 100 times). Calculated values when it was assumed that Ta was deteriorated, calculated values when Ta was normal, and measurement results after removing TEOS shown in FIG. 7 are shown in FIG. 8 for each layer thickness of the sample.

While the resistance of Sample #1 after the treating process was close to the resistance when Ta was deteriorated, the resistance of Sample #1 before the treating process was close to the resistance when Ta was normal.

Accordingly, in a cap layer having a conventional configuration (Ta (5 nm)/Ru (7 nm)), as in Sample #1, the Ta layer under the Ru layer is likely to be deteriorated in depositing TEOS as the insulating layer 61 (Second Step) and in forming the contact holes (reactive etching in Third Step).

It is necessary to make the Ru layer sufficiently thick (about 50 nm) for protecting the Ta layer against the treating process.
[Verification 3]

On the basis of the above Verifications 1 and 2, the following countermeasures A and B were taken for reduction of stray resistance and for comparison.

In Countermeasure A, the layer thickness of the Ru layer in the cap layer is increased to 50 nm while it is 7 nm in the conventional one.

In Countermeasure B, the electrode material is deposited after etching 20 nm of the Ru layer in the cap layer from the surface by reverse sputtering under vacuum.

As shown in Table II, in a comparative example with no countermeasure and a comparative example in which only the Countermeasure A was taken, the surface of the Ru layer was slightly cleaned (subjected to a descumming process) by Ar etching as usual.

An example in which Countermeasures A and B were taken corresponded to the inventive example. As shown in Table II, 20 nm of the Ru layer was etched from the surface by reverse sputtering in vacuum for 20 minutes.

Figure 9:
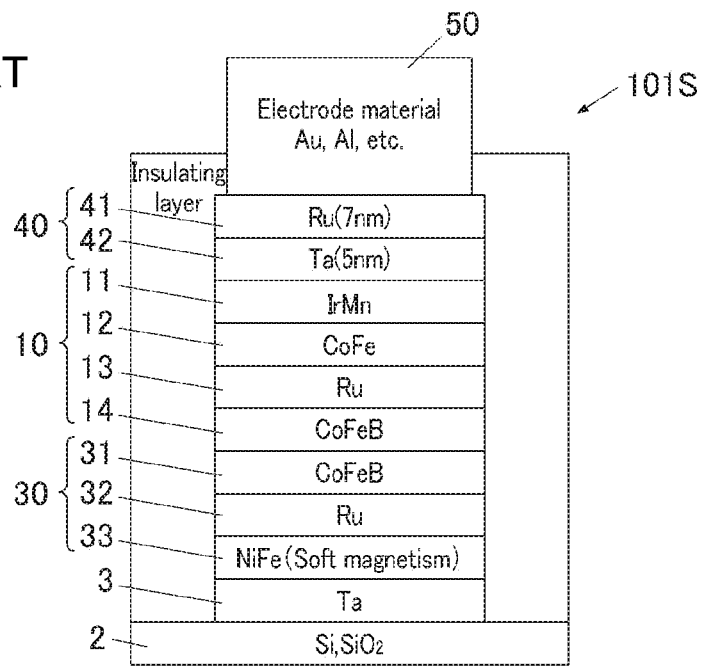
FIG. 9 is a cross-sectional view showing a stack structure of a conventional tunnel magnetoresistive element without an insulating layer (MgO) according to Verification 3.
Figure 10:
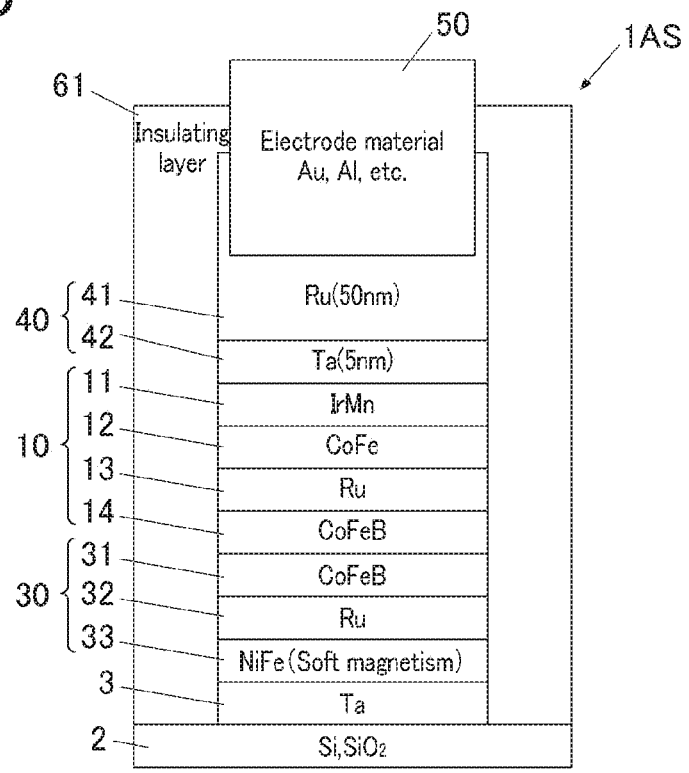
FIG. 10 is a cross-sectional view showing a stack structure of a tunnel magnetoresistive element an example of the present invention without an insulating layer (MgO) according to Verification 3.

FIG. 9 and FIG. 10 show a schematic view of the element for verification.

Either elements do not include an insulating layer (MgO) 20. The element 1015 shown in FIG. 9 corresponds to a structure of the tunnel magnetoresistive element 101 of the conventional example shown in FIG. 1, except that the insulating layer (MgO) 20 is removed. However, the cap layer 40 is left as it is for verification. The cap layer 40 has a Ta layer 42 of 5 nm and a Ru layer 41 of 7 nm. The element 1AS shown in FIG. 10 corresponds to a structure of the tunnel magnetoresistive element 1A of the inventive example shown in FIG. 2, except that the insulating layer (MgO) 20 is removed. The cap layer 40 has a Ta layer 42 of 5 nm and a Ru layer 41 of 50 nm. However, 20 nm of the Ru layer 41 is etched. As the comparative example in which only Countermeasure A is taken corresponds to an example in which such etching is not performed, a Ru layer of 50 nm is left as it is.

Figure 11:
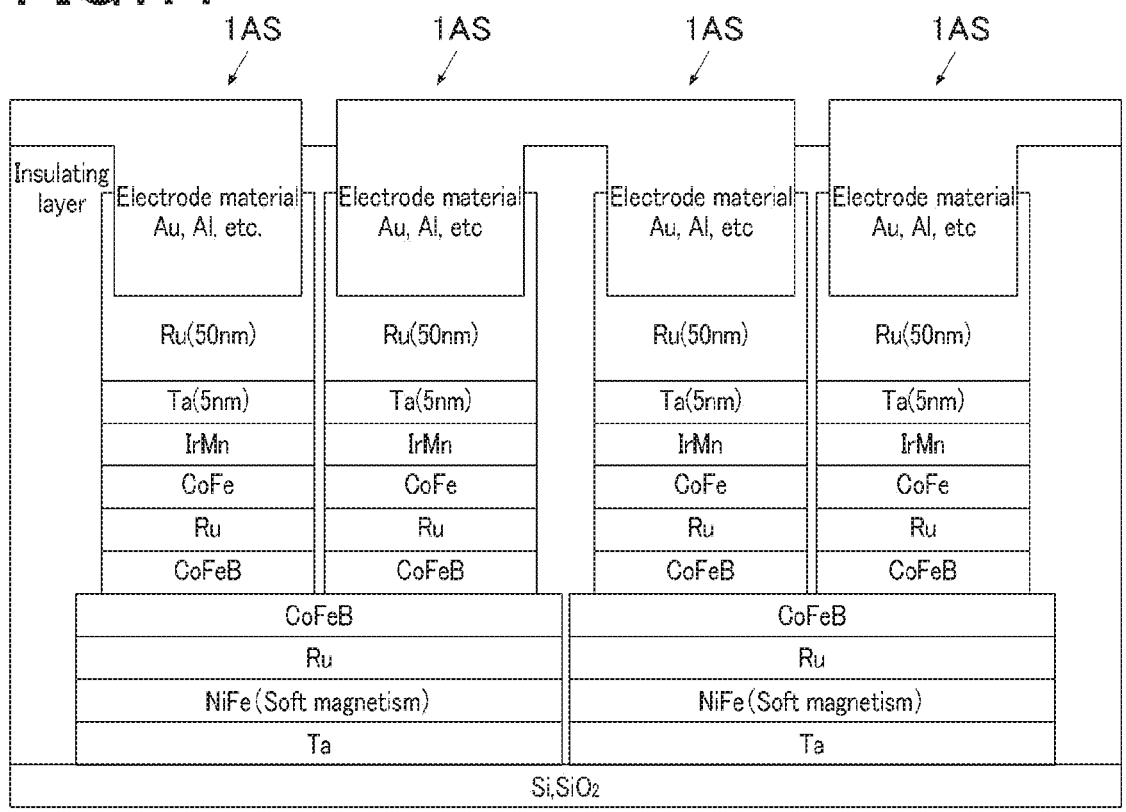
FIG. 11 is a cross-sectional view showing a stack structure of integrated series circuits of the elements shown in FIG. 10 according to Verification 3.

Integration of elements is performed in series for each of the above-described elements for verification, and, after the treating process, it is verified whether or not the resistance (stray resistance) which should not be normally included is sufficiently reduced by the countermeasure(s) for reduction. FIG. 11 shows a stack structure of the integrated series circuit for the elements 1AS. Other elements for verification were similarly integrated. Three hundred elements of an 80 μm square were arranged in series in common.

Figure 12:
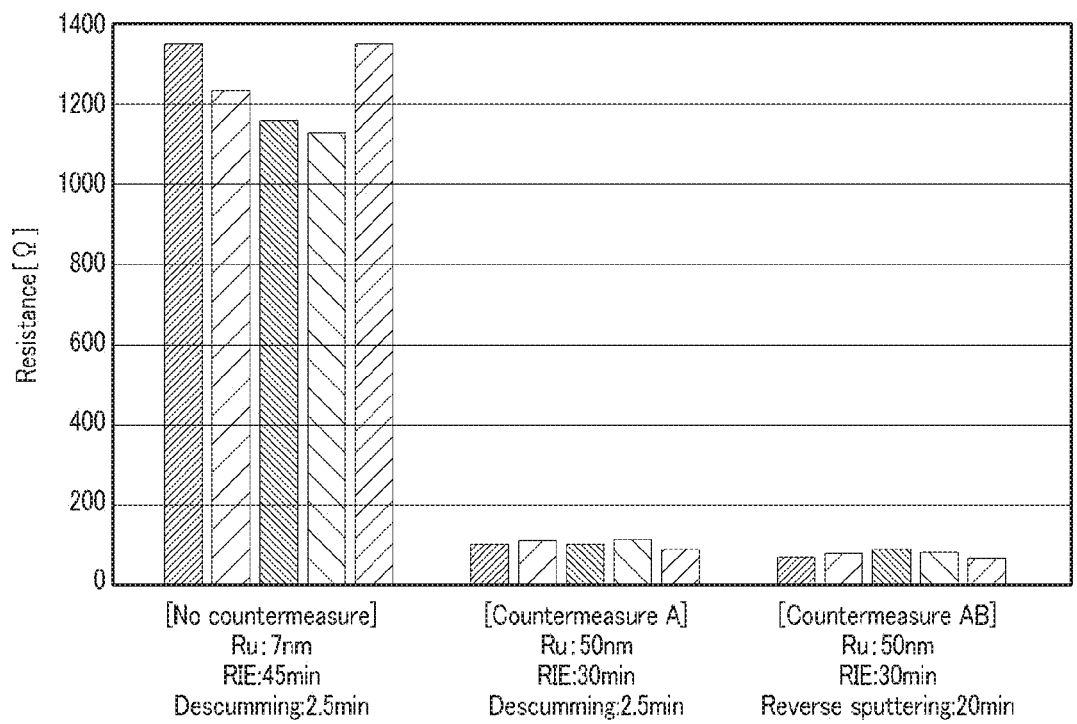
FIG. 12 is a graph showing resistances of Sample Circuits 1 to 5 of each integrated series circuits after treating processes according to verification 3.

Sample Circuits 1 to 5 of each of the above-described integrated series circuits (no countermeasure, countermeasure A, countermeasure AB) were made, and the results of the resistance were summarized in Table II and shown in the graph in FIG. 12.

TABLE II

|  | [No countermeasure] Layer thickness of Ru: 7 nm Descumming: 2.5 min | [Countermeasure A] Layer thickness of Ru: 50 nm Descumming: 2.5 min | [Countermeasure AB] Layer thickness of Ru: 50 nm Reverse sputtering: 20 min |
|---|---|---|---|
| Resistance of Sample Circuit 1 | 1350 Ω | 99.1 Ω | 68.8 Ω |
| Resistance of Sample Circuit 2 | 1236 Ω | 108 Ω | 77.2 Ω |
| Resistance of Sample Circuit 3 | 1154 Ω | 105.5 Ω | 84.6 Ω |
| Resistance of Sample Circuit 4 | 1126 Ω | 109.4 Ω | 82 Ω |
| Resistance of Sample Circuit 5 | 1352 Ω | 92.9 Ω | 62.9 Ω |
| Average | 1244 Ω | 103.4 Ω | 75.1 Ω |
| Stray resistance per element | 3.4 Ω | 0.28 Ω | 0.2 Ω |

In a TMR element, a magnetic field is detected on the basis of the change in the resistance of the insulating layer (MgO) 20. Therefore, if there is no insulating layer (MgO) 20, it is ideally required that the resistance is zero.

According to the comparative example in which the above countermeasure A for reduction was taken and the inventive example in which the countermeasure A and B for reduction were taken, the stray resistance could be reduced to about ¹/₁₀ to ¹/₁₅ of that according to the comparative example in which no countermeasure was taken.

As shown in Table II, the resistance was the smallest according to the inventive example in which the countermeasures A and B for reduction were taken because of the reverse sputtering (countermeasure B). It is desirable to also etch the surface layer of Ru since it is resistant to the treating process but may be slightly deteriorated.

As described above, according to the production method for the magnetoresistive element of the present embodiment, the cap layer 40 is sufficiently thick at the beginning of deposition in forming the magnetoresistive layer. After the subsequent predetermined treating process(es), the cap layer 40 of less than the entire thickness is etched so that the cap layer 40 is left. As a result, it is possible to achieve desired magnetoresistive characteristics by effectively achieving protection with the cap layer 40 and by reducing adverse effects due to the cap layer 40.

INDUSTRIAL APPLICABILITY

The present invention can be applied to measurement of magnetism and the like.

REFERENCE SIGNS LIST 1A, 1B Tunnel magnetoresistive element
2 Substrate
3 Underlayer
10 Pinned magnetic layer
20 Insulating layer
30 Free magnetic layer
14, 31 Ferromagnetic layer
33 Soft magnetic layer
40 Cap layer

The invention claimed is:

1. A production method for a magnetoresistive element, comprising:
   treating a stacked layer into a predetermined shape, the stacked layer including a magnetoresistive layer whose resistance changes depending on a magnetic field and a cap layer which is above the magnetoresistive layer and which has a layer thickness in a range of 10 nm to 60 nm;
   covering and protecting the stacked layer with an insulating layer;
   forming an opening in the insulating layer by reactive etching and exposing a surface of the cap layer at the opening;
   etching the cap layer in a range less than a total layer thickness of the cap layer by ion milling of the surface of the cap layer which is exposed at the opening in the exposing; and
   depositing an upper layer to be a part of the magnetoresistive element, the upper layer being in contact with the surface of the cap layer which is left after the etching.

2. The production method for a magnetoresistive element according to claim 1, wherein, in the etching, a layer thickness of the cap layer etched by ion milling is in a range of 0.5 nm to 59.5 nm.

3. The production method for a magnetoresistive element according to claim 1, wherein one or more materials of the cap layer are selected from the following: Ru, Ta, Al, Ag, Au, Si, Ti, V, Zr, Nb, Mo, Hf, and W.

4. The production method for a magnetoresistive element according to claim 1, wherein a material of the insulating layer is thermally oxidized silicon, and a gas for processing used in the reactive etching is a mixed gas including fluorine and oxygen.

5. The production method for a magnetoresistive element according to claim 1, wherein an outer edge of the opening formed in the forming is inside an outer edge of the cap layer which has been treated in the treating.

6. A magnetoresistive element comprising:
a magnetoresistive layer whose resistance changes depending on a magnetic field;
a cap layer above the magnetoresistive layer; and
an upper layer which is a part of the magnetoresistive element and in contact with the surface of the cap layer,
wherein the cap layer has a hollow structure which is a hollow surface on an opposite side of the magnetoresistive layer,
wherein the upper layer which is a part of the magnetoresistive element is in contact with an inner bottom surface of the hollow surface, and
wherein the cap layer has a layer thickness in a range of 10 nm to 60 nm around the inner bottom surface of the hollow structure.

7. The magnetoresistive element according to claim 6, wherein a distance between the inner bottom surface of the hollow structure and an upper edge around the inner bottom surface is in a range of 0.5 nm to 59.5 nm.

8. The magnetoresistive element according to claim 6, wherein one or more materials of the cap layer are selected from the following: Ru, Ta, Al, Ag, Au, Si, Ti, V, Zr, Nb, Mo, Hf, and W.

9. The magnetoresistive element according to claim 6, wherein an insulating layer covers and protects a periphery of the magnetoresistive layer, a periphery of the cap layer, an upper edge surface around the inner bottom surface of the hollow structure, and a periphery of the upper layer which is a part of the magnetoresistive element.

10. The magnetoresistive element according to claim 9, wherein a material of the insulating layer is thermally oxidized silicon.

11. The magnetoresistive element according to claim 6, wherein the upper layer which is a part of the magnetoresistive element is an electrode layer.

12. The magnetoresistive element according to claim 6,
wherein the cap layer is in contact with a ferromagnetic layer of the magnetoresistive layer, and
wherein the upper layer which is a part of the magnetoresistive element is a soft magnetic layer.

13. The magnetoresistive element according to claim 12, wherein a layer thickness of the cap layer between the soft magnetic layer and the ferromagnetic layer is less than 1 nm.

* * * * *